(12) United States Patent
Ji

(10) Patent No.: US 6,740,571 B2
(45) Date of Patent: May 25, 2004

(54) METHOD OF ETCHING A DIELECTRIC MATERIAL IN THE PRESENCE OF POLYSILICON

(75) Inventor: Hua Ji, San Jose, CA (US)

(73) Assignee: Mosel Vitelic, Inc. (TW)

( * ) Notice: Subject to any disclaimer, the term of this patent is extended or adjusted under 35 U.S.C. 154(b) by 0 days.

(21) Appl. No.: 10/202,992

(22) Filed: Jul. 25, 2002

(65) Prior Publication Data

US 2004/0018684 A1 Jan. 29, 2004

(51) Int. Cl.$^7$ .......................................... H01L 21/3205
(52) U.S. Cl. ........................ 438/585; 438/280; 257/348

(56) References Cited

U.S. PATENT DOCUMENTS

| | | | |
|---|---|---|---|
| 4,517,106 A | 5/1985 | Hopkins et al. ............ | 252/79.4 |
| 4,620,934 A | 11/1986 | Hopkins et al. ............ | 252/79.4 |
| 5,491,104 A * | 2/1996 | Lee et al. .................... | 438/254 |
| 5,948,703 A | 9/1999 | Shen et al. .................. | 438/714 |
| 6,077,742 A * | 6/2000 | Chen et al. .................. | 438/255 |
| 6,162,683 A | 12/2000 | Chen .......................... | 438/258 |
| 6,291,310 B1 * | 9/2001 | Madson et al. ............. | 438/424 |
| 6,303,962 B1 * | 10/2001 | Gardner et al. ............. | 257/347 |
| 6,358,818 B1 | 3/2002 | Wu ............................. | 438/431 |
| 6,444,495 B1 * | 9/2002 | Leung et al. ............... | 438/118 |
| 6,486,060 B2 * | 11/2002 | Hermes et al. ............. | 438/649 |

OTHER PUBLICATIONS

Stanley Wolf, Richard Tauber, "Silicon Processing for the VLSI Era" Lattice Press, vol. 1–Process Technology, 1986, pp. 532–534.

C.Y. Chang, S.M. Sze, "ULSI Technology", Product description, McGraw–Hill International Editions, Singapore, pp. 74–76.

"Ultra–Etch Buffered Oxide Etchants", Product description, Ashland, Inc., Electronic Chemicals Division, pp. 1–8.

"Buffered Oxide Etchants (BHF), Clean Room Electronic Chemicals" Product description, Ashland, Inc., Electronic Chemicals Division, Feb. 2000.

"Ultra–Etch Surfactanated Buffered Oxide–Etchants (BHF), Clean Room Electronic Chemicals", Product description, Ashland, Inc., Electronic Chemicals Division, Feb. 2000.

* cited by examiner

Primary Examiner—Nathan J. Flynn
Assistant Examiner—Olivia T. Luk
(74) Attorney, Agent, or Firm—MacPherson Kwok Chen & Heid LLP; David S. Park

(57) ABSTRACT

A method is provided for advantageously etching dielectric material between highly integrated polysilicon devices with high dielectric-to-polysilicon selectivity to expose polysilicon with minimal polysilicon loss and without photoresist lift. A wet etch solution comprising surfactant and between about 0% and about 10% $NH_4F$ is used to wet etch the dielectric material and reduce polysilicon loss thickness, polysilicon resistance ratios, and polysilicon etch rates, while increasing dielectric-to-polysilicon selectivity. Advantageously, the present invention may penetrate into increasingly small geometries of highly integrated devices and may also be used for general wet etches of dielectric material in conjunction with photoresist.

20 Claims, 8 Drawing Sheets

METHOD OF ETCHING A DIELECTRIC MATERIAL IN THE PRESENCE OF POLYSILICON

BACKGROUND

1. Field of Invention

The present invention generally relates to semiconductor processing and, more particularly, to a method of wet etching a dielectric material while exposing polysilicon.

2. Related Art

With increasing densities of up to hundreds of thousands of devices on a single chip, improper isolation among devices, such as flash memory devices, will cause current leakage, which can consume significant amounts of power. In addition, improper isolation between devices can damage the circuit temporarily or permanently. Still further, improper isolation can result in noise margin degradation, voltage shift, or crosstalk.

One isolation technique proposed for semiconductor chips with high integration is the trench isolation process, or the shallow trench isolation (STI) process. A trench region is formed in the semiconductor with a depth deep enough for isolating the devices or different wells. In general, a trench is etched and filled with insulating or dielectric materials, such as silicon dioxide. The insulating material is then etched to expose portions of the devices, many of which contain polysilicon.

Typically, a wet etchant has been used to etch the insulating material between the devices. A conventional wet etchant is hydrofluoric acid (HF) diluted with deionized water. Diluted HF has the advantage of dissolving silicon dioxide without attacking silicon, silicon nitride, or polysilicon. Problems encountered with the use of typical diluted HF solutions have included lack of etch penetration into small geometries related to shrinking trench widths and lifting of the photoresist in wet etch processes involving photoresist masks.

Another conventional wet etchant is a buffered oxide etchant (BOE) solution comprising HF mixed with ammonium fluoride ($NH_4F$), deionized water, and a surfactant. A BOE solution is useful to provide a consistent etch rate due to the extra fluorine buffer. Problems encountered with the use of a typical BOE solution have included gate polysilicon loss concurrent with the etch of the insulating material.

Therefore, what is needed is a method to etch insulating material between highly integrated devices having very small geometries with minimal gate polysilicon loss. Further, etching insulating material between highly integrated devices with the aforementioned characteristics in conjunction with a photoresist is desirable when processing certain devices.

SUMMARY

The present invention provides a method for forming two gate structures separated by a dielectric and wet etching the dielectric between the gate structures to expose at least a portion of the polysilicon layer of the gate structures with minimal polysilicon loss.

In one embodiment of the present invention, a method of etching a dielectric layer in the presence of polysilicon comprises forming two gate structures over a semiconductor substrate, each of the gate structures comprising a polysilicon layer, forming a trench between the two gate structures, depositing a dielectric layer between the two gate structures, and etching portions of the dielectric layer with a wet etch solution to expose polysilicon portions of the gate structures, the wet etch solution comprising surfactant and between about 0% and 10% by weight $NH_4F$.

In another embodiment, a method of etching a dielectric layer in the presence of polysilicon comprises forming two gate structures over a semiconductor substrate, each of the gate structures comprising a polysilicon layer, forming a trench between the two gate structures, depositing a dielectric layer between the two gate structures, and etching portions of the dielectric layer with a wet etch solution to expose polysilicon portions of the gate structures, the wet etch solution comprising surfactant and between about 0% and 10% by weight $NH_4F$, and the etching occurring with a dielectric-to-polysilicon selectivity above about 15.

In yet another embodiment of the present invention, a method of manufacturing a semiconductor device comprises forming a first region over a semiconductor substrate, the first region having at least two gate structures, and each of the at least two gate structures comprising a polysilicon layer, forming a second region over the semiconductor substrate, forming a trench between the at least two gate structures, depositing a dielectric layer between the at least two gate structures, forming a photoresist layer over the second region, and etching portions of the dielectric layer only in the first region with a wet etch solution to expose polysilicon portions of the at least two gate structures, the wet etch solution comprising between about 0% and 10% by weight $NH_4F$.

Advantageously, the present invention provides a method for etching dielectric material between highly integrated polysilicon devices having small geometries with high dielectric-to-polysilicon selectivity to expose polysilicon with less polysilicon loss than was previously possible with conventional methods. Further, the present invention advantageously allows for highly selective wet etching in conjunction with photoresist without lifting of the resist.

This invention will be more fully understood in light of the following detailed description taken together with the accompanying drawings.

BRIEF DESCRIPTION OF DRAWINGS

Use of the same reference symbols in different figures indicates similar or identical items. It is noted that the above figures are not drawn to scale.

DETAILED DESCRIPTION

Figure 1:
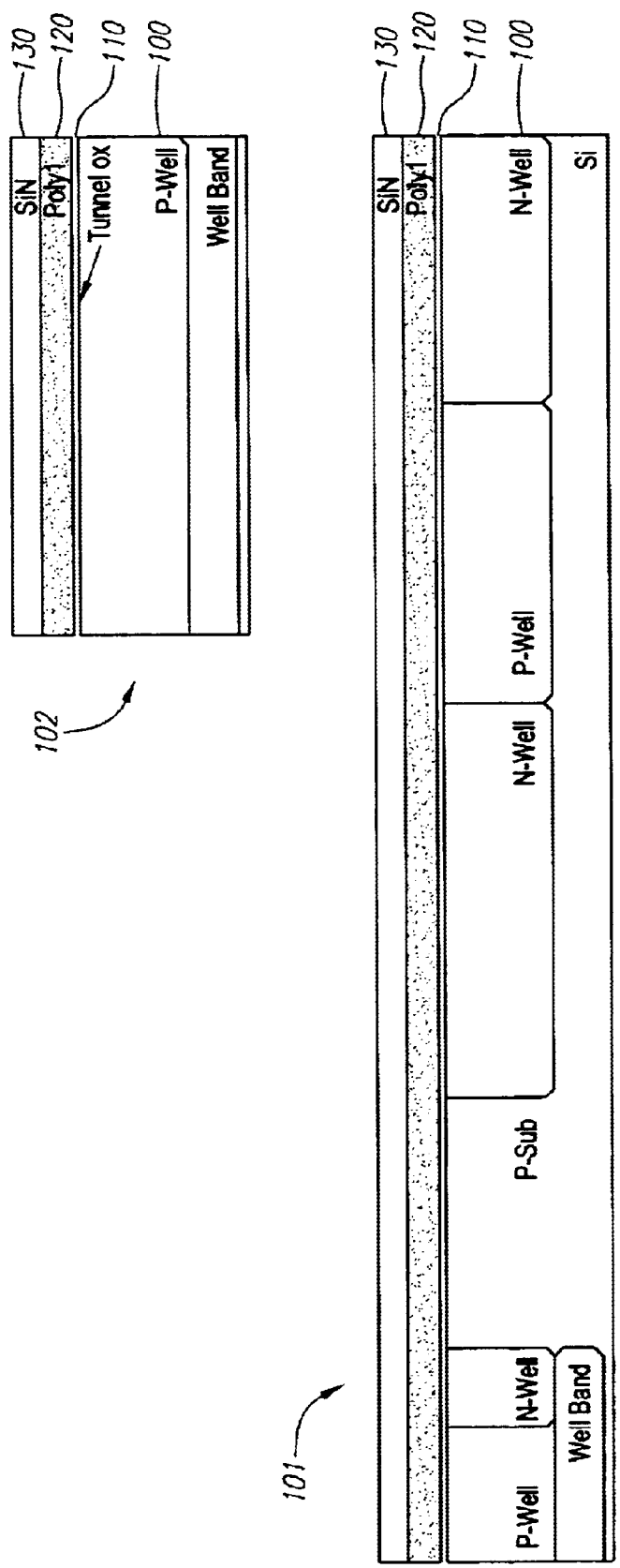
FIG. 1 shows a cross-section view of a semiconductor substrate with a first region and a second region, with an insulator layer, polysilicon layer, and nitride layer formed on the substrate.

FIGS. 1–6 illustrate cross-section views of one example of a semiconductor manufacturing process in which the present invention may be used. As shown in FIG. 1, layers of material are formed on a semiconductor substrate 100, which may be doped by conventional means with dopants at different dosage and energy levels to form wells. Substrate 100 may be a wafer formed from a single crystalline silicon material. Substrate 100 may also comprise other materials, for example, an epitaxial material, a polycrystalline semiconductor material, or other suitable material. Substrate 100 may also comprise additional layers of semiconductor material.

As also illustrated in FIG. 1, a first region 101 and a second region 102 are formed to manufacture a semiconductor device, such as a flash memory device. It should be noted, however, that the present invention may be used for various dielectric etching steps in the processing of various semiconductor devices and is not limited to the manufacture of flash memory devices. Further, it is noted that first region 101 and second region 102 may be juxtaposed next to one another or may be separated by various areas, regions, or circuitry of the substrate or device. In one example, first region 101 is a memory array region of a flash memory device and may include a plurality of gate structures, with each gate structure having a polysilicon layer and an insulator layer. The gate structures are separated by trenches filled with dielectric material. In a further example, second region 102 is a periphery region of a flash memory device and may include support circuitry, such as read/write/erase control circuitry, a decoder, or other necessary controlling components.

As further shown in FIG. 1, a thin insulator layer 110 is formed over substrate 100. Insulator layer 110 acts as a tunnel oxide layer for gate structures 108 (FIG. 7), which are eventually formed. Insulator layer 110 may comprise silicon dioxide, formed, for example, in a thermal furnace with an oxygen-containing ambient. It will be understood that insulator layer 110 may comprise other materials suitable for insulating semiconductor elements, such as silicon nitride. Insulator layer 110 may be on the order of 90 Å in thickness.

A polysilicon layer 120, used to form gates of flash memory transistors in one example, is then formed over insulator layer 110, as illustrated in FIG. 1. Polysilicon layer 120 comprises amorphous silicon and may be doped as the layer is deposited. Dopants may comprise phosphorous and/or nitrogen. For example, to create n-type polysilicon material, phosphorous doping agents may be introduced at different dosage and energy levels. In one example, polysilicon layer 120 may be grown to a thickness of about 1,200 Å by any suitable deposition process, such as a low pressure chemical vapor deposition (LPCVD) process, while being doped with phosphorous dopants at a dosage of 1.8E15 ions/cm$^2$ and energy of 10 KeV.

Figure 6:
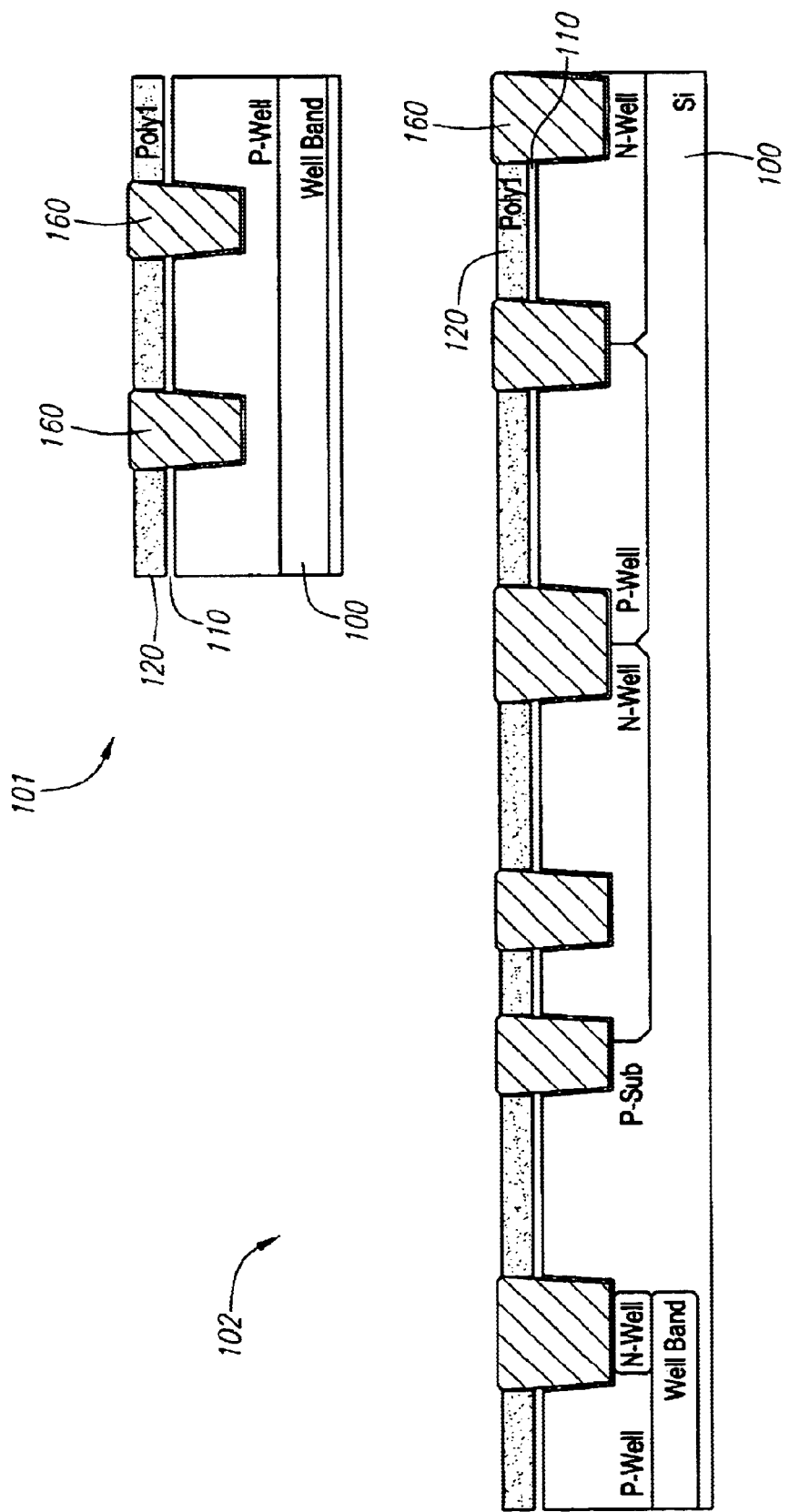
FIG. 6 shows a cross-section view of the structure illustrated in FIG. 5 after the nitride layer is stripped.

FIG. 1 further shows a nitride layer 130 formed on top of polysilicon layer 120. Nitride layer 130 acts as a stop layer for a later planarization step (FIG. 6). In one example, nitride layer 130 may be formed to a thickness between about 700 Å and about 1,500 Å using any suitable deposition process, such as a LPCVD process.

Figure 2:
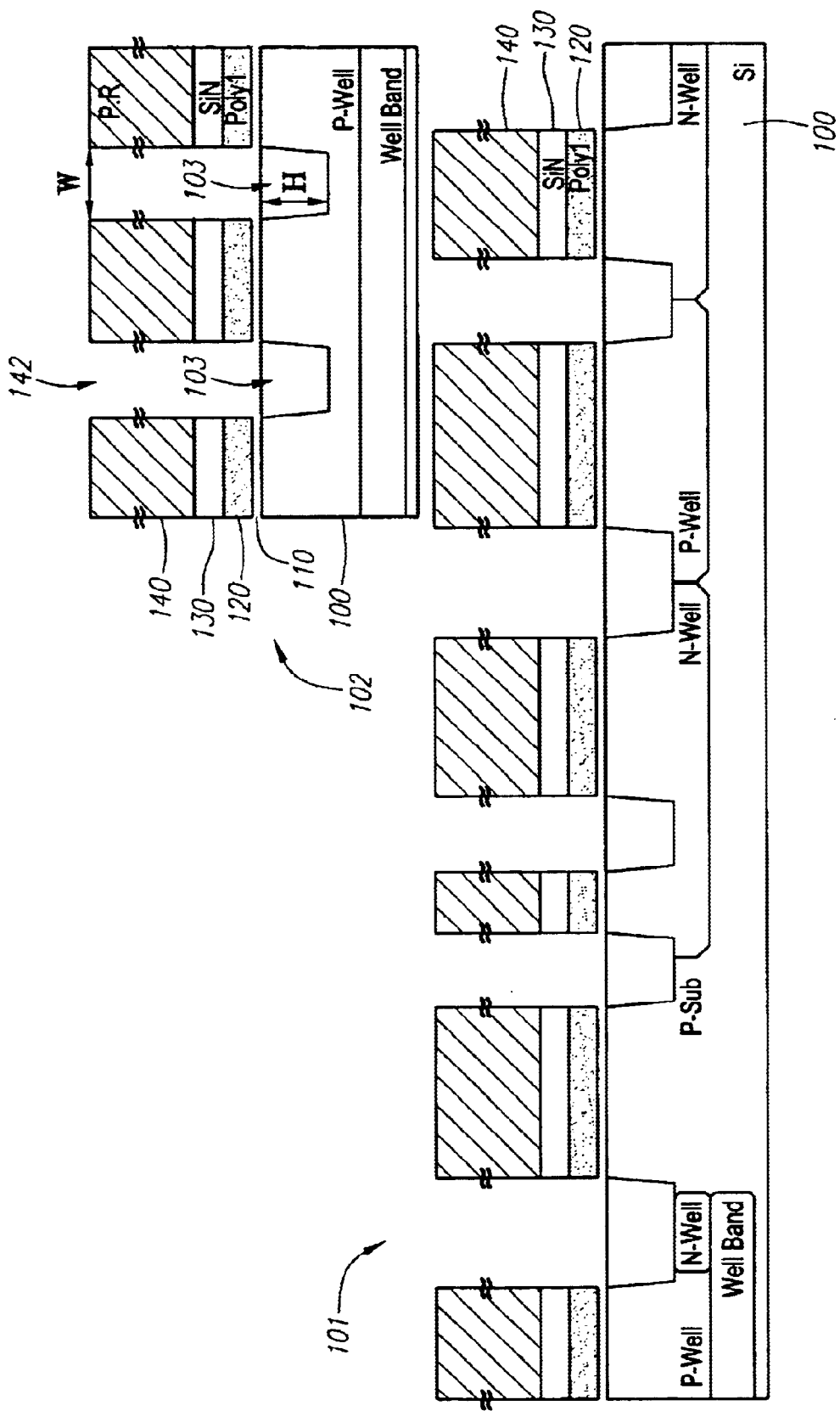
FIG. 2 shows a cross-section view of the structure illustrated in FIG. 1 after an anisotropic etch through a photoresist mask to form trenches in the substrate between gate structures.

Thereafter, a photoresist layer 140 is formed over nitride layer 130, as illustrated in FIG. 2. Photoresist layer 140 may include an active region pattern 142 to be used for later patterning of underlying layers. Photoresist layer 140 is defined using standard photoresist coating, exposure, and development processes in the conventional lithography technology.

Next, as illustrated in FIG. 2, nitride layer 130, polysilicon layer 120, insulator layer 110, and part of substrate 100 are anisotropically etched using photoresist layer 140 as a mask to form trenches 103. Trenches 103 are formed to desired heights H and widths W. In one example, trench height H may range between about 2,000 Å and about 2,800 Å, and trench width W may range between about 0.16 $\mu$m and about 0.3 $\mu$m. However, the present invention may be used with various trench heights and widths and various geometries ranging beyond the aforementioned examples. The patterning step can be performed by conventional anisotropic etch processes, such as reactive ion etch (RIE) processes.

Figure 3:
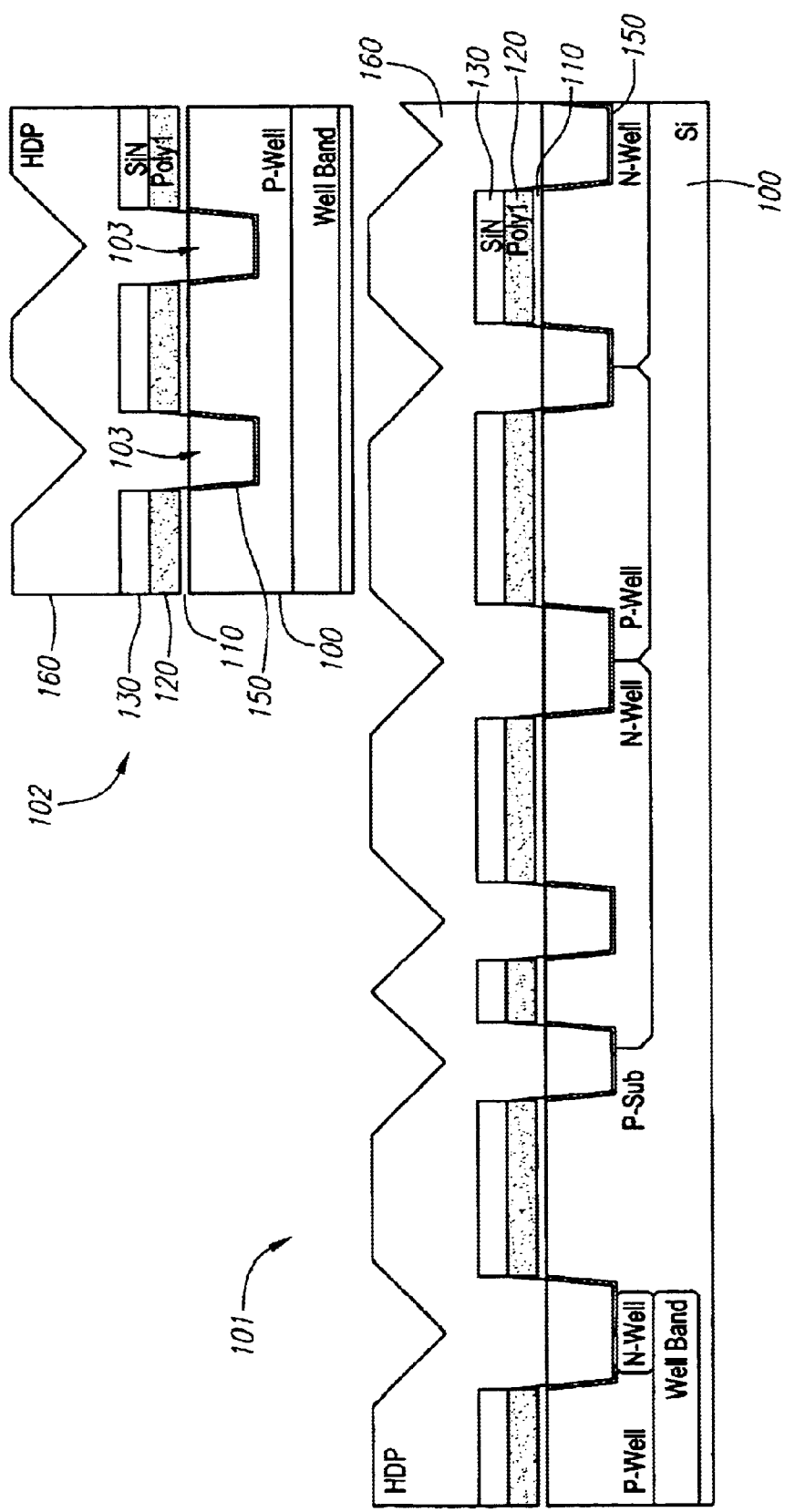
FIG. 3 shows a cross-section view of the structure illustrated in FIG. 2 after the photoresist mask is stripped, an oxide layer is conformably formed over the trenches, and a dielectric layer is deposited over the gate structures and trenches.

Referring now to FIG. 3, photoresist layer 140 (not shown) is stripped from the top of nitride layer 130. In one example, photoresist layer 140 may be stripped by a conventional process, such as a resist ash.

An oxide layer 150 may then be conformally formed over trench structures 103. In one example, oxide layer 150 is a thermal oxide layer conformably formed on polysilicon layer 120, insulator layer 110, and substrate 100.

FIG. 3 further illustrates the formation of dielectric layer 160 to fill up trenches 103 and cover the gate structures. Dielectric layer 160 may be formed by any deposition process, such as high density plasma chemical vapor deposition (HDP CVD). In one example, dielectric layer 160 may comprise silicon dioxide. A major reaction gas such as silane (SiH$_4$) may be used in the dielectric layer formation. After such a silicon oxide deposition step, a thermal anneal process is performed to densify the deposited silicon oxide and improve the characteristics of the oxide as an insulation material.

Figure 4:
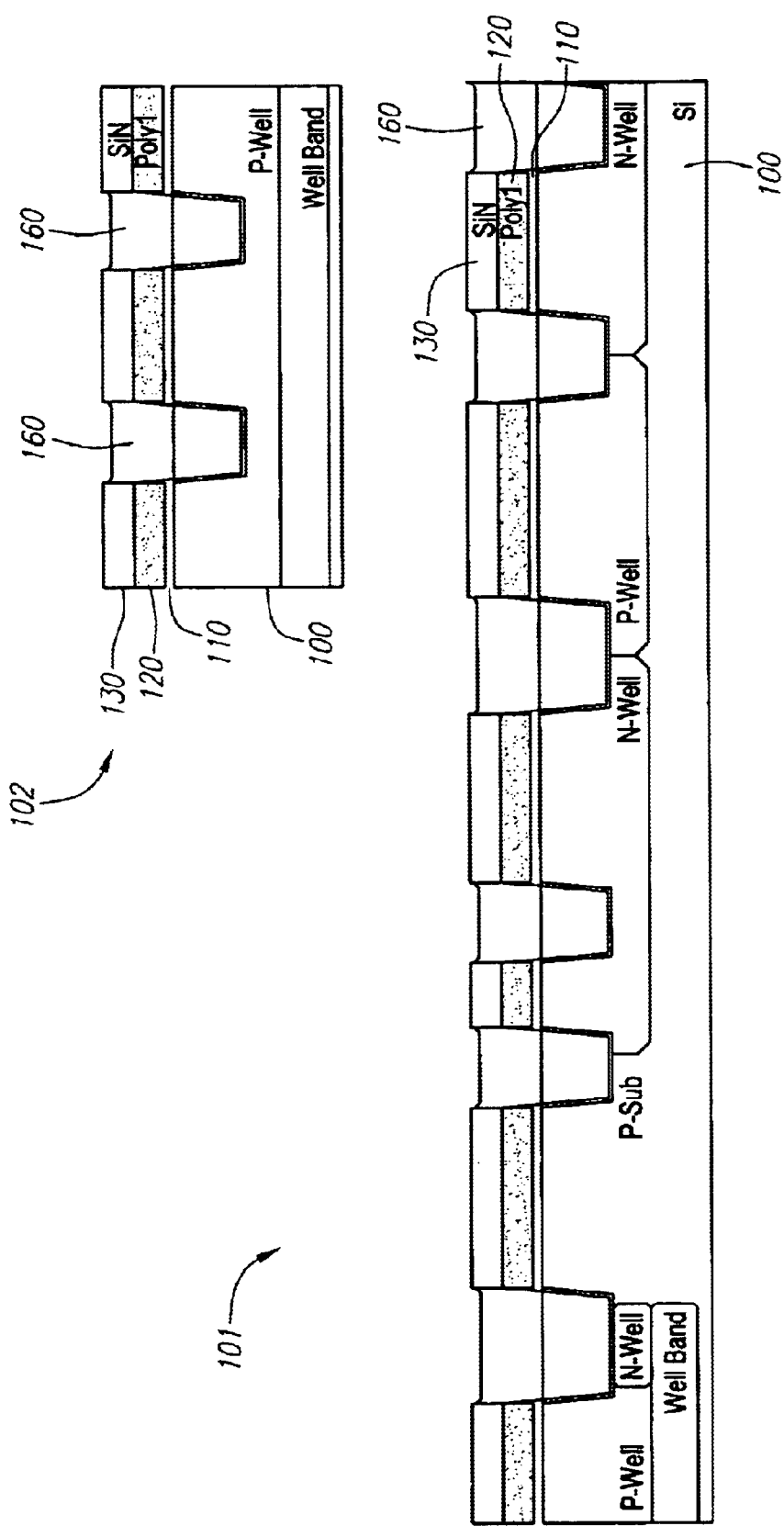
FIG. 4 shows a cross-section view of the structure illustrated in FIG. 3 after planarization to the nitride layer of the gate structures.

As shown in FIG. 4, dielectric layer 160 is then planarized downward until portions of nitride layer 130 is contacted or removed. In one example, chemical mechanical planarization (CMP) is performed to remove the top portions of dielectric layer 160.

Figure 5:
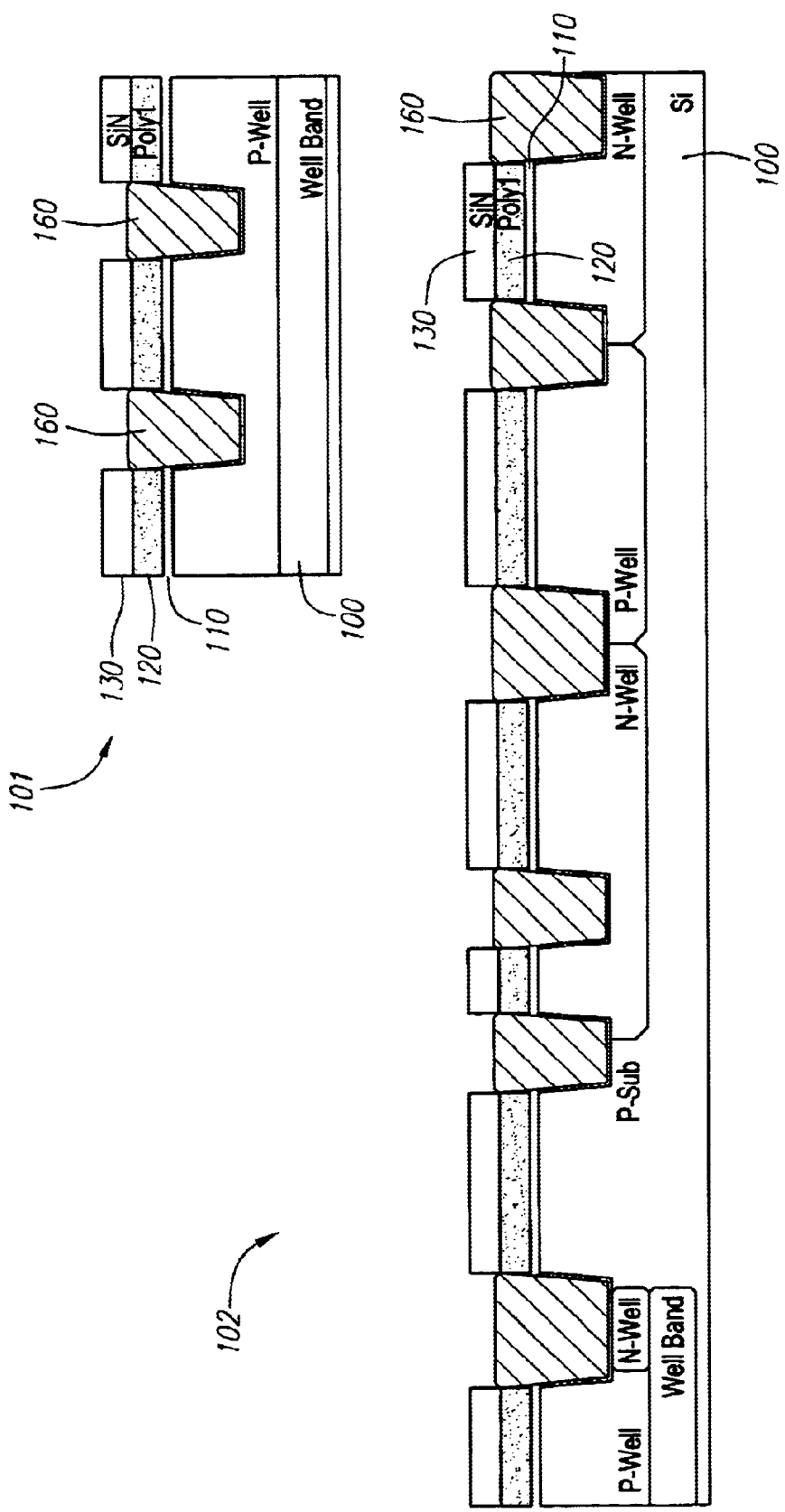
FIG. 5 shows a cross-section view of the structure illustrated in FIG. 4 after an etch of the dielectric layer to the polysilicon layer.

A wet etch step may follow the planarization step to etch dielectric layer 160 to the top level of polysilicon layer 120, as shown in FIG. 5. This wet etch step may currently be performed by a conventional method, such as by using a conventional diluted HF solution. However, diluted HF solutions may not effectively penetrate into increasingly small geometries and trench widths, and as such, the present invention may be utilized in this step to effectively etch into such small geometries and trench widths with minimal polysilicon loss.

Nitride layers 130 may then be stripped by a conventional process, as shown in FIG. 6. In one example, phosphoric acid (H$_3$PO$_4$) may be used to perform the nitride strip.

During the formation of semiconductor devices, it may be necessary to form structures and/or layers of material on one region of the device that are not present on the other region, or to form structures and/or layers that require different dimensions on different regions of the device. As such, a photoresist layer may be used to form such different structures and/or layers in different device regions.

Figure 7:
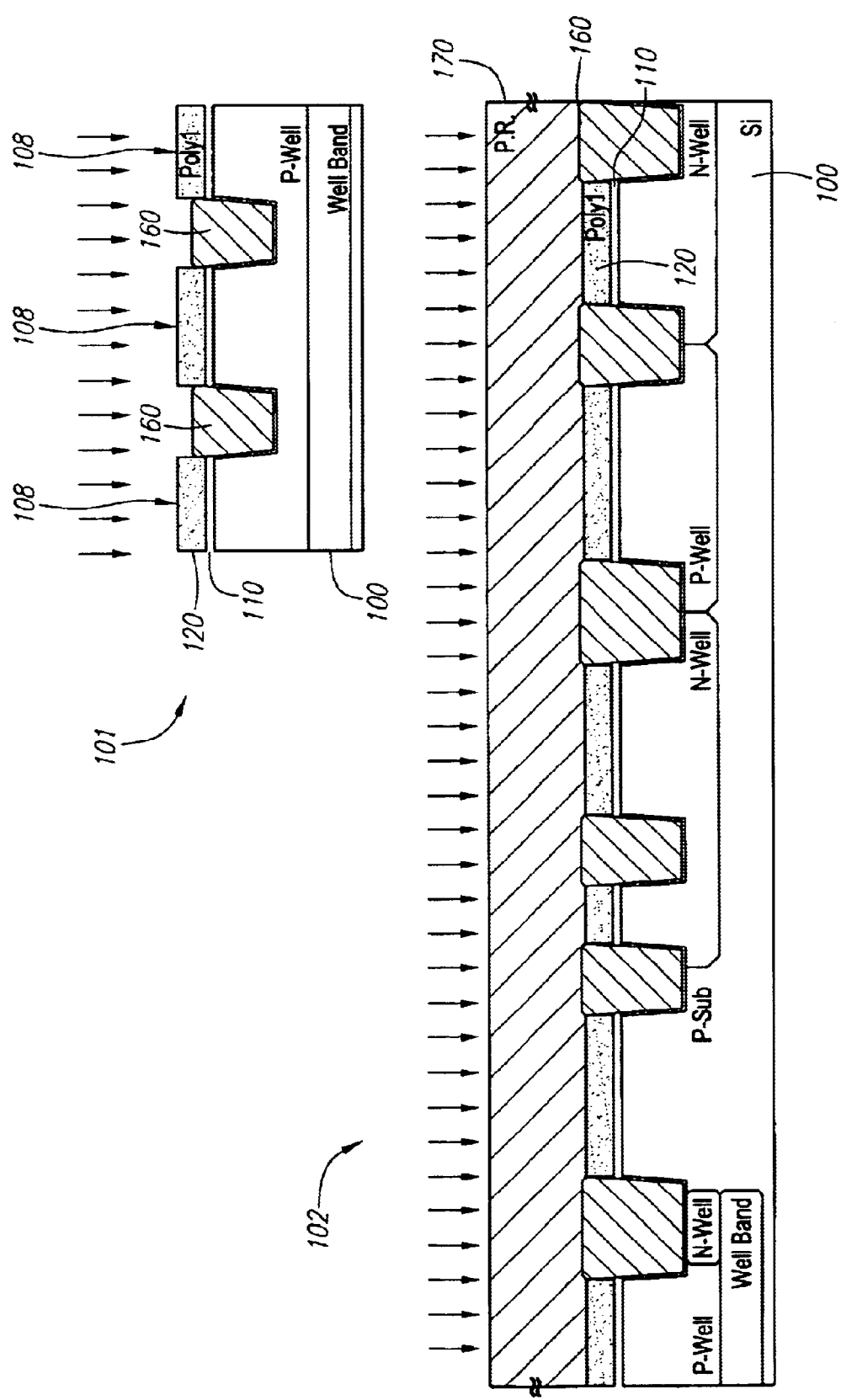
FIG. 7 shows a cross-section view of the structure illustrated in FIG. 6 after a wet etch step with minimal polysilicon loss and no photoresist lift, in accordance with one embodiment of the present invention.

As illustrated in FIG. 7, in one example, a photoresist layer 170 is formed over trenches and gate structures of second region 102 while first region 101 is left uncovered. When a wet etch is performed in accordance with the present invention, dielectric layer 160 and oxide layer 150 are etched downward to expose portions of polysilicon layer 120. Different levels of polysilicon layer 120 will be exposed based upon process and application requirements. Advantageously, the present invention may be used to etch dielectric material between highly integrated devices in conjunction with photoresist without lifting of the photoresist, thereby alleviating masking problems associated with photoresist lift. Dielectric material 160 between the gate structures in first region 101 is etched with high dielectric-to-polysilicon selectivity to expose the polysilicon of the gate structures with minimal polysilicon loss. However, the dielectric material between the trenches in second region 102 is not affected by the wet etch because photoresist layer 170 covers second region 102 without lifting. Advantageously, the present invention allows for this etching step in conjunction with photoresist whereas a conventional diluted HF solution could not be used because of photoresist lift problems caused by high surface tension. However, conventional BOE solutions may be used for etching in conjunction with photoresist because of its lower surface tension.

Figure 8A:
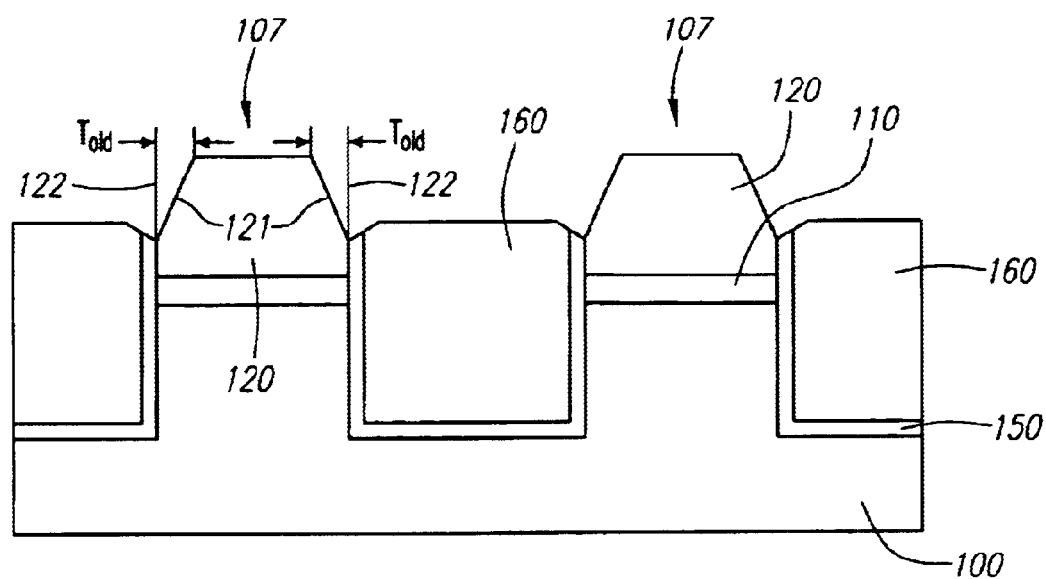
FIG. 8A shows a cross-section view of a device after a typical dielectric wet etch step in which undesirable polysilicon loss occurs.

FIG. 8A highlights the results of a wet etch step that would occur using a conventional BOE solution to etch dielectric layer 160 and oxide layer 150 to expose portions of polysilicon layer 120. Typical BOE solutions were created to have a more consistent etch rate with an increased buffer of fluorine, but it has been found that the buffer source of $NH_4F$ undesirably etches into the polysilicon layer concurrently with the dielectric layer. Thus, if a conventional wet etchant could be used with photoresist, undesirable amounts of polysilicon would be etched. This polysilicon loss is highlighted in FIG. 8A by the difference between sloped sides 121 of etched polysilicon layer 120 and dashed perpendicular lines 122, which represent the original sides of polysilicon layer 120 prior to the dielectric etch step.

Different indicators may be determined to measure polysilicon loss during a dielectric etch. Polysilicon loss may be measured by a polysilicon loss thickness, such as loss thickness $T_{old}$ in FIG. 8A, measured by the difference between sloped sides 121 and dashed lines 122. A larger polysilicon loss thickness indicates greater polysilicon loss. A typical method of measuring polysilicon loss thickness may be used, such as by optical emission spectroscopy in conjunction with a dummy or monitoring wafer. A ratio of sheet resistances may also be used to measure doped polysilicon loss. Sheet resistance ratio is defined as the ratio of the polysilicon layer sheet resistance after the dielectric etch ($R_{s-a}$) to the polysilicon layer sheet resistance before the dielectric etch ($R_{s-b}$). A larger sheet resistance ratio ($R_{s-a}/R_{s-b}$) indicates higher polysilicon loss, and conversely, a smaller $R_{s-a}/R_{s-b}$ value indicates less polysilicon loss. Finally, dielectric-to-polysilicon selectivity measures a ratio of the dielectric etch rate to the polysilicon etch rate. A higher dielectric-to-polysilicon selectivity indicates less polysilicon is etched away when etching away comparable amounts of the dielectric.

Figure 8B:
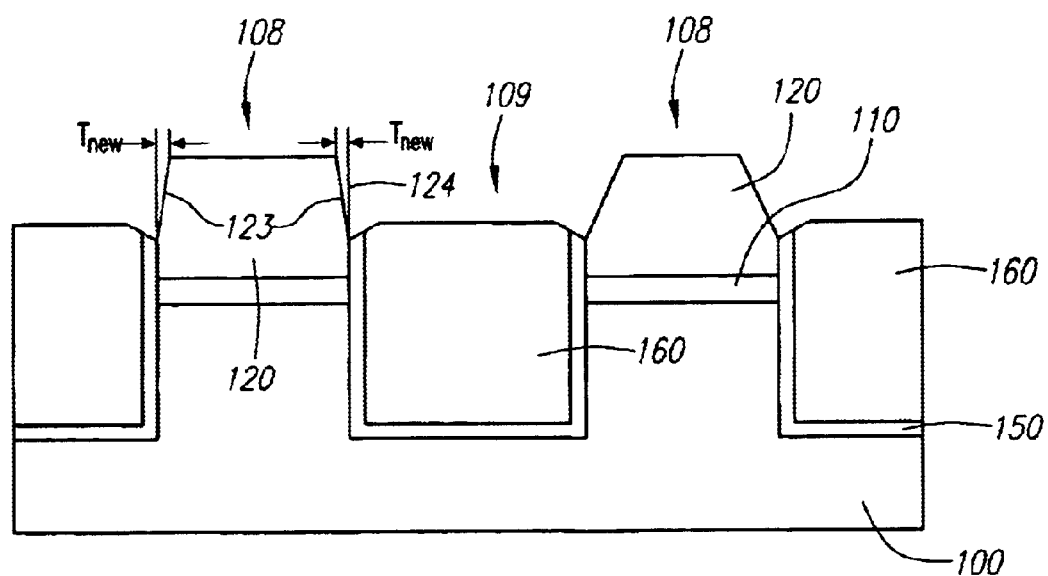
FIG. 8B shows a cross-section view of a device after a dielectric wet etch with minimal polysilicon loss in accordance with one embodiment of the present invention.

In accordance with one embodiment of the present invention, FIG. 8B illustrates the results of a wet etch step using a method of the present invention to etch dielectric layer 160 and oxide layer 150 to expose portions of polysilicon layer 120 with minimal polysilicon loss. Polysilicon layer 120 of gate structures 108 is exposed with less polysilicon loss than was previously possible with conventional methods, as indicated by a reduced polysilicon loss thickness $T_{new}$ (FIG. 8B) as compared to polysilicon loss thickness $T_{old}$ (FIG. 8A) ($T_{new}<T_{old}$) Loss thickness $T_{new}$ is measured between sloped sides 123 of etched polysilicon layer 120 and perpendicular dashed lines 124, which represent the original sides of polysilicon layer 120 prior to the dielectric etch step.

In one embodiment of the present invention, a wet etch solution comprising between about 0% and 10% by weight $NH_4F$ is used for the etch step. The wet etch solution further comprises between about 0.05% and about 8.5% by weight HF, between about 81.5% and about 99.9% by weight deionized water, and between about 25 ppm and about 2,000 ppm surfactant.

In accordance with the present invention, $NH_4F$ may be included as a fluorine buffer but is reduced in concentration to increase dielectric-to-polysilicon selectivity. Further, $NH_4F$ may be excluded from the composition. Both of these wet etch embodiments are counter to typical wet etch compositions which promoted higher concentrations of $NH_4F$ to achieve a more consistent etch rate. However, dielectric-to-polysilicon selectivity has become a concern in many processes. HF is included to maintain a desired dielectric etch rate. The surfactant is included to maintain a low surface tension to allow for etch penetration into small geometries. An example of a surfactant which may be used in the present invention is the ES-1 fluorocarbon surfactant, available from Ashland Specialty Chemical Company, Columbus, Ohio.

Tables I–III below provide three sets of examples comparing polysilicon loss indicators between conventional methods and a method of the present invention for etching comparable dielectric layers in the presence of comparable polysilicon layers. In accordance with one embodiment of the present invention, the wet etch solution used in the new wet etch method of Tables I–III comprised about 10% by weight $NH_4F$, about 1% by weight HF, about 89% by weight deionized water, and ES-1 surfactant.

Table I provides data for a 6,000 Å HDP oxide layer and a 1,200 Å polysilicon layer, both materials being doped with phosphorous (P) at 1.8E15 ions/cm² and 10 KeV. To achieve a 500 Å etch of the HDP oxide layer, the BOE solution etch took place for approximately 4 minutes at 22° C. The new solution etch took place for approximately 1 minute at 22° C.

Table II provides data for a 6,000 Å HDP oxide layer and a 1,800 Å polysilicon layer, both materials being doped with phosphorous (P) at 3.0E15 ions/cm² and 10 KeV. To achieve a 800 Å etch of the HDP oxide layer, the BOE solution etch took place for approximately 8 minutes at 22° C. The new solution etch tool place for approximately 1 minute and 50 seconds at 22° C.

Table III provides etch rate data for a 6,000 Å HDP oxide layer and a 2,000 Å polysilicon layer, both materials being undoped. All three etches, whether utilizing a conventional HF solution, a conventional BOE solution, or the new wet etch solution, took place for approximately 3 minutes at 22° C.

A wet etch method in accordance with the present invention may be performed in any conventional wet etch tank. In one example, a recirculating, filtered tank, model US-600, may be used, available from Universal Systems, San Jose, Calif.

TABLE I

| 500 Å Doped HDP Oxide Etch in Presence of 1,200 Å Doped Polysilicon Layer | Conventional BOE Method | New Wet Etch Solution Method |
|---|---|---|
| Poly Loss Thickness (Å) | 47 | 6.5 |
| Poly Sheet Resistance (after etch) ($R_{s-a}$) | 268.8 | 241.0 |
| Poly Sheet Resistance (before etch) ($R_{s-b}$) | 229.2 | 229.2 |
| ($R_{s-a}$)/($R_{s-b}$) Ratio | 1.17 | 1.05 |
| HDP Oxide Etch Rate (Å/min) | 129.8 | 580 |
| Poly Etch Rate (Å/min) | 11.75 | 6.47 |
| HDP Oxide-to-Poly Selectivity | 11 | 89.6 |

TABLE II

| 800 Å Doped HDP Oxide Etch in Presence of 1800 Å Doped Polysilicon Layer | Conventional BOE Method | New Wet Etch Solution Method |
|---|---|---|
| Poly Loss Thickness (Å) | 88 | 17.3 |
| Poly Sheet Resistance (after etch) ($R_{s-a}$) | 161.6 | 123.6 |
| Poly Sheet Resistance (before etch) ($R_{s-b}$) | 104.6 | 104.6 |
| ($R_{s-a}$)/($R_{s-b}$) Ratio | 1.54 | 1.18 |
| HDP Oxide Etch Rate (Å/min) | 98 | 408 |
| Poly Etch Rate (Å/min) | 11 | 9.46 |
| HDP Oxide-to-Poly Selectivity | 8.9 | 43.1 |

TABLE III

| Undoped HDP Oxide Etch in Presence of 2,000 Å Undoped Polysilicon Layer | Conventional Diluted HF Method (100:1 HF) | Conventional Buffer Oxide Etchant (BOE) Method (100:1 BOE) | New Wet Etch Solution Method |
|---|---|---|---|
| Thermal oxide etch rate (Å/min) | 38.51 | 84.3 | 197 |
| HDP oxide etch rate (Å/min) | 43.66 | 76.67 | 213 |
| Polysilicon etch rate (Å/min) | 2.36 | 14.13 | 1.6 |
| Thermal oxide-to-Poly Selectivity | 16.3 | 6.0 | 123 |
| HDP oxide-to-Poly Selectivity | 18.5 | 5.4 | 133 |

In one example of the present invention, polysilicon loss thickness is decreased from about 47 Å to about 6.5 Å for an etch of about 500 Å of comparable dielectric layers in the presence of comparable polysilicon layers. In another example, polysilicon loss thickness is decreased from about 88 Å to about 17.3 Å for an etch of about 800 Å of comparable dielectric layers in the presence of comparable polysilicon layers.

In a second example of the present invention, the sheet resistance ratio ($R_{s-a}$)/($R_{s-b}$) is reduced from about 1.17 to about 1.05 for an etch of about 500 Å of comparable dielectric layers in the presence of comparable polysilicon layers. In another example, the sheet resistance ratio ($R_{s-a}$)/($R_{s-b}$) is reduced from about 1.54 to about 1.18 for an etch of about 800 Å of comparable dielectric layers in the presence of comparable polysilicon layers.

In a further example of the present invention, the polysilicon etch rate is decreased from about 11.8 Å/min to about 6.5 Å/min for an etch of about 500 Å of comparable dielectric layers in the presence of comparable polysilicon layers. In another example, the polysilicon etch rate is decreased from about 11.0 Å/min to about 9.5 Å/min for an etch of about 800 Å of comparable dielectric layers in the presence of comparable polysilicon layers. In a third example, the polysilicon etch rate is decreased from about 14.13 Å/min to about 1.6 Å/min for an etch of comparable undoped dielectric layers in the presence of comparable undoped polysilicon layers. However, dielectric-to-polysilicon selectivity is increased in the aforementioned three examples, from about 11 to about 89.6, from about 8.9 to about 43.1, and from about 5.4 to about 133, respectively. In accordance with the present invention, dielectric-to-polysilicon selectivity above about 15 is achieved.

Using a method of the present invention, polysilicon loss thickness, polysilicon sheet resistance ratios, and polysilicon etch rates are reduced while dielectric-to-polysilicon selectivity is increased to advantageously etch dielectric material between highly integrated polysilicon gate structures with minimal polysilicon loss.

The above-described embodiments of the present invention are merely meant to be illustrative and not limiting. Various changes and modifications may be made without departing from this invention in its broader aspects. For example, a method of the present invention may be used in different processes to replace dry etching through a photoresist mask to etch a dielectric layer in the presence of polysilicon with high dielectric-to-polysilicon selectivity. Further, it will be understood that depending upon specific process flows, various processing modules and implants may take place prior to the dielectric etch step in the presence of polysilicon. Therefore, the appended claims encompass all such changes and modifications as fall within the true spirit and scope of this invention.

What is claimed is:

1. A method of etching a dielectric layer in the presence of polysilicon, comprising:
    forming two gate structures over a semiconductor substrate, each of said gate structures comprising a polysilicon layer;
    forming a trench between said gate structures;
    depositing a dielectric layer between said two gate structures;
    forming a photoresist layer over a region of said substrate; and
    etching portions of said dielectric layer with a wet etch solution to expose polysilicon portions of said gate structures, said wet etch solution comprising surfactant and between about 0% and 10% by weight $NH_4F$.

2. The method of claim 1, wherein each of said gate structures further comprise an insulator layer underneath said polysilicon layer, and a silicon nitride layer over said polysilicon layer.

3. The method of claim 1, wherein said dielectric layer comprises silicon oxide.

4. The method of claim 1, wherein said wet etch solution further comprises between about 0.05% and about 8.5% by weight HF.

5. The method of claim 4, wherein said wet etch solution further comprises between about 81.5% and about 99.9% by weight deionized water.

6. The method of claim 5, wherein said wet etch solution comprises between about 25 ppm and about 2,000 ppm surfactant.

7. A method of etching a dielectric layer in the presence of polysilicon, comprising:

forming two gate structures over a semiconductor substrate, each of said gate structures comprising a polysilicon layer;

forming a trench between said two gate structures;

depositing a dielectric layer between said two gate structures;

forming a photoresist layer over a region of said substrate; and etching portions of said dielectric layer with a wet etch solution to expose polysilicon portions of said gate structures, said wet etch solution comprising surfactant and between about 0% and 10% by weight $NH_4F$, and said etching occurring with a dielectric-to-polysilicon selectivity above about 15.

8. The method of claim 7, wherein each of said gate structures further comprise an insulator layer underneath said polysilicon layer, and a silicon nitride layer over said polysilicon layer.

9. The method of claim 7, wherein said dielectric layer comprises silicon oxide.

10. The method of claim 7, wherein said wet etch solution further comprises between about 0.05% and about 8.5% by weight HF.

11. The method of claim 10, wherein said wet etch solution further comprises between about 81.5% and about 99.9% by weight deionized water.

12. The method of claim 11, wherein said wet etch solution further comprises between about 25 ppm and about 2,000 ppm surfactant.

13. A method of etching a dielectric layer in the presence of polysilicon, comprising:

forming two gate structures over a semiconductor substrate, each of said gate structures comprising a polysilicon layer;

forming a trench between said two gate structures;

depositing a dielectric layer between said gate structures; and etching portions of said dielectric layer with a wet etch solution to expose polysilicon 0% and 10% by weight $NH_4F$., wherein said etching occurs with a dielectric-to-polysilicon selectivity above about 15, and further wherein said etching occurs with a polysilicon etch rate from about 1 Å/min to about 10 Å/min.

14. A method of manufacturing a semiconductor device, comprising:

forming a first region over a semiconductor substrate, said first region having at least two gate structures, and each of said at least two gate structures comprising a polysilicon layer, forming a second region over said semiconductor substrate;

forming a trench between said at least two gate structures;

depositing a dielectric layer between said at least two gate structures;

forming a photoresist layer over said second region; and etching portions of said dielectric layer only in said first region with a wet etch solution to expose polysilicon portions of said at least two gate structures, said wet etch solution comprising between about 0% and 10% by weight $NH_4F$.

15. The method of claim 14, wherein said first region is a memory array region of a flash memory device.

16. The method of claim 14, said second region is a periphery region of a flash memory device.

17. The method of claim 14, wherein said dielectric layer comprises silicon oxide.

18. The method of claim 14, wherein said wet etch solution further comprises between about 0.05% and about 8.5% by weight HF.

19. The method of claim 18, wherein said wet etch solution further comprises between about 81.5% and about 99.9% by weight deionized water.

20. The method of claim 19, wherein said wet etch solution further comprises between about 25 ppm and about 2,000 ppm surfactant.

* * * * *